United States Patent
Stabler

(10) Patent No.: US 7,148,694 B1
(45) Date of Patent: Dec. 12, 2006

(54) CONTACT IMPEDANCE TEST CIRCUIT AND METHOD

(75) Inventor: Martin L. Stabler, Lutz, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/148,571

(22) Filed: Jun. 3, 2005

(51) Int. Cl.
*G01R 31/02* (2006.01)

(52) U.S. Cl. .................. 324/421; 324/709; 324/713

(58) Field of Classification Search ............... 324/691, 324/709, 722, 421, 713
See application file for complete search history.

(56) References Cited

U.S. PATENT DOCUMENTS

| | | | |
|---|---|---|---|
| 3,919,504 A | 11/1975 | Crosley et al. ....... | 179/175.2 R |
| 4,516,076 A | 5/1985 | Pillari et al. .................. | 324/418 |
| 5,138,264 A * | 8/1992 | Seki et al. .................. | 324/439 |
| 5,491,424 A * | 2/1996 | Asar et al. .................. | 324/715 |
| 6,025,726 A * | 2/2000 | Gershenfeld et al. ....... | 324/671 |
| 6,323,669 B1 | 11/2001 | Kang .......................... | 324/765 |
| 6,337,573 B1 | 1/2002 | Ronaccio et al. ........... | 324/757 |
| 6,784,671 B1 * | 8/2004 | Steele et al. ................. | 324/640 |
| 6,967,483 B1 * | 11/2005 | Kwark ....................... | 324/421 |
| 2006/0034493 A1 * | 2/2006 | Shimamura et al. ........ | 382/115 |

* cited by examiner

*Primary Examiner*—Vincent Q. Nguyen
(74) *Attorney, Agent, or Firm*—John Tarlano

(57) ABSTRACT

A contact impedance test circuit for testing impedance between a first contact element and a second contact element comprising an AC signal source for applying an AC signal voltage to the first contact element, an AC contact voltage being emitted by the second contact element, an AC amplifier connected to the second contact element for amplifying the AC contact voltage from the second contact element, an amplified AC contact voltage being produced by the AC amplifier, and a phase angle voltmeter for detecting phase difference between the amplified AC contact voltage and the AC signal voltage at an instance of time, the AC. signal voltage being applied to a reference input of the phase angle voltmeter, the amplified AC contact voltage being applied to a signal input of the phase angle voltmeter.

4 Claims, 2 Drawing Sheets

CONTACT IMPEDANCE TEST CIRCUIT AND METHOD

In the past, a contact resistance test circuit generated a large amount of sensing current to detect variations in contact resistance between two contact elements, over time. The contact resistance could be the result of contaminates on each of the contact elements. Such contact elements could be a bush and slip rig of a motor. A sensing device, such as an ohmmeter, was used to sense small changes in the large amount of sensing current that passed between the contact elements.

Due to use of the large sensing current, a small change in the amount of sensing current passing between the contact elements, due to contact resistance, was difficult to measure. A varying amount of contact resistance between the contact elements did not appreciably vary the amount of current. Therefore it was difficult to determine contact resistance and thus to determine an amount of contaminants on each of the contact elements.

The disclosed contact impedance test circuit senses contact impedance between two contact elements that are in contact. The two contact elements are a first and second contact element. The disclosed contact impedance test circuit has an AC signal source of an alternating voltage signal, that is, AC signal voltage. The AC signal source provides the AC signal voltage, having a low amplitude, to the first contact element. The contact impedance test circuit also has an AC voltage amplifier for amplifying an AC, contact voltage from the second contact element. The contact impedance test circuit has a phase angle voltmeter for detecting any phase difference between the AC signal voltage and the AC contact voltage.

The disclosed contact impedance test circuit can be used to detect contact impedance between two contact elements, and to detect contact impedance changes between the two contact elements over time. The contact impedance changes can be the result of contaminates that are between contact elements.

Contact impedance between the two contact elements can slightly change due to effects of contaminants being on and between the two contact elements. Small contact impedance changes are able to be detected by the disclosed contact impedance test circuit, since only a small AC current passes between the two contact elements.

The disclosed contact impedance test circuit incorporates an AC signal source that produces an AC signal voltage having a selected frequency. The AC signal source generates an AC sensing current. The AC sensing current is passed to a first contact element. A delayed sensing current is generated in a second contact element. A low AC contact voltage is generated in the second contact element by the AC signal voltage.

The phase angle voltmeter of the contact impedance test circuit detects any phase difference between the original AC signal voltage and the AC contact voltage from the second contact element at an instance of time. Any detected phase difference is due to the contamination between the contact elements. The contamination produces contact impedance between the contact elements. Further, the frequency of the AC signal voltage can be adjusted in order to be in tune with the frequency detecting capability of the phase angle voltmeter.

Contaminates on the contact elements can produce capacitance between the contact elements. The amount of capacitance between the contact elements is proportional to the amount of contaminants on the contact elements. The capacitance causes the phase of the contact voltage from the second contact element to lag the phase of the signal voltage. The disclosed contact impedance test circuit test circuit indirectly detects the capacitance due to the contaminates, by detecting a phase difference. The amount of phase difference is proportional to the amount of contaminates on contact elements. The amount of contaminates on the contact elements produces an amount of contact impedance.

The present contact impedance test circuit produces a low level A. C. contact voltage from the second contact element. Small variations in the amount of contact voltage from the second contact element can be determined. The contact impedance test circuit incorporates a low-voltage-amplitude AC signal source for producing the AC contact voltage from the second contact element.

An AC contact voltage from the second contact element, is sent to an AC voltage amplifier. The AC voltage amplifier amplifies the AC contact voltage, to produce an amplified AC contact voltage.

The amplified AC contact voltage, from the AC voltage amplifier, is sent to a signal input of the phase angle voltmeter. The AC signal voltage from the AC signal source is sent to a reference input of the phase angle voltmeter. The amplified AC contact voltage and AC signal voltage are compared within the phase angle voltmeter. Any change in the difference in voltage between the amplified AC contact voltage and the AC signal voltage, over time, is sent from the phase angle voltmeter to an output device. Any difference in phase between the amplified AC contact voltage and the AC signal voltage, over time, is sent from the phase angle voltmeter to an output device.

A significant feature of the present invention is that an A.C. signal source, frequency output is variable, is used.

Again, the A.C. signal voltage is sent to a first contact element, the first contact element being in contact with a second contact element. An AC contact voltage, that is generated in the second contact element, is then sent to the AC amplifier. The amplified AC contact voltage is sent to the signal input of the phase angle voltmeter. The AC signal voltage is also sent to the reference input of the phase angle voltmeter. The amplified AC contact voltage and AC signal voltage are compared within the phase angle voltmeter. If there is a phase difference between the AC signal voltage and the AC contact voltage, over time, this phase difference is outputted by the phase angle voltmeter to an input device.

The disclosed contact impedance test circuit provides an accurate means for determining a phase difference between an AC contact voltage and an AC signal voltage. Precise measurements of minute changes in contact impedance between the contact elements can be determined by using frequency excitation of the contact elements.

SUMMARY OF THE INVENTION

A contact impedance test circuit for testing contact impedance between a first contact element and a second contact element comprising an AC signal source for applying an A.C. signal voltage to the first contact element, an AC contact voltage being emitted from the second contact element, an AC amplifier for amplifying the AC contact voltage from the second contact element, an amplified AC contact voltage being produced by the AC amplifier, and a phase angle voltmeter for detecting phase difference between the amplified AC contact voltage and the AC signal voltage at an instance of time, the AC signal voltage being applied to a reference input of the phase angle voltmeter, the amplified AC contact voltage being applied to a signal input of the phase angle voltmeter.

DESCRIPTION OF THE PREFERRED EMBODIMENT

Figure 1:
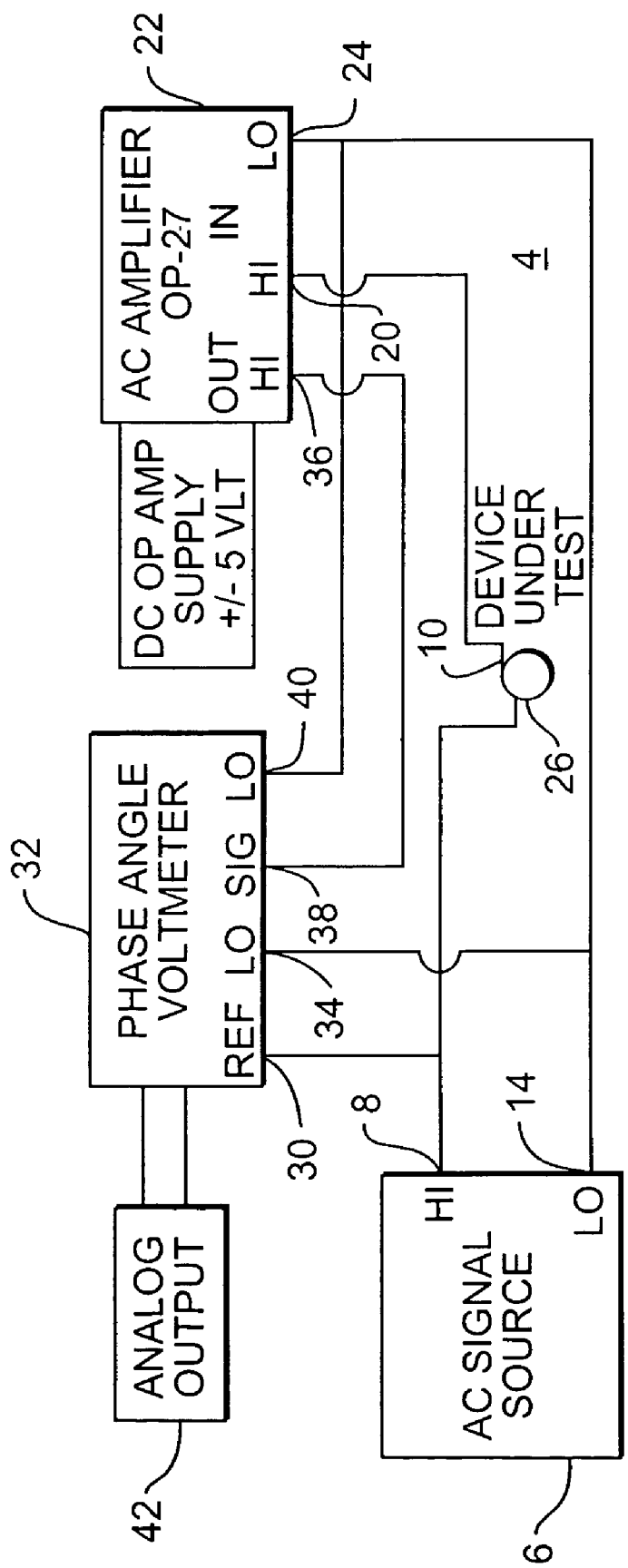
FIG. 1 is a block diagram of a contact impedance test circuit.
Figure 2:
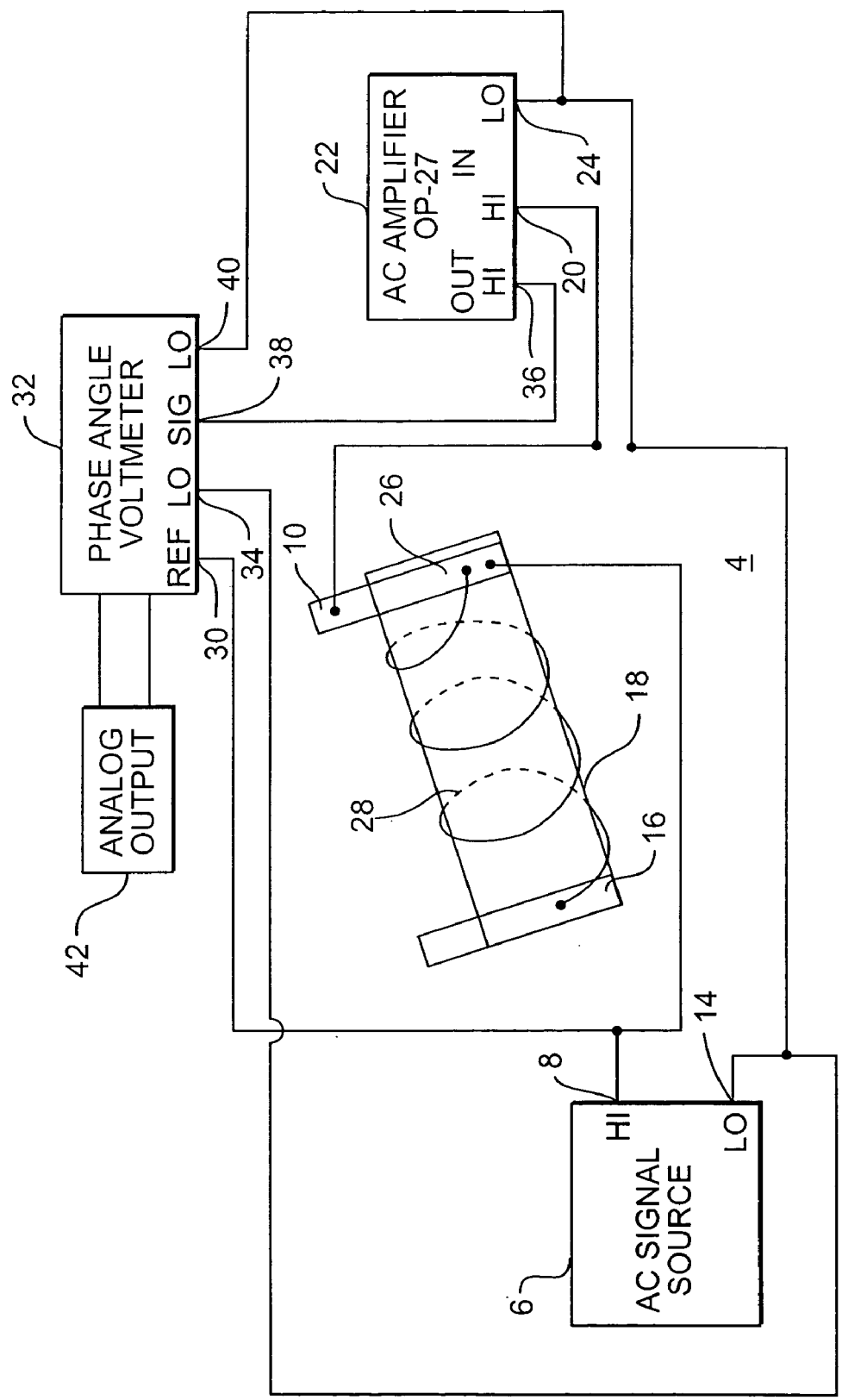
FIG. 2 is a block diagram of a contact impedance test circuit plus a perspective view of a rotor and brushes of a motor.

FIG. 1 shows a contact impedance test circuit 4. The contact impedance test circuit 4 has an AC signal source 6. A HIGH output 8 of the AC signal source 6 id connected to a slip ring 26. The slip ring 26 is located on a rotor 18 shown in FIG. 2. The rotor 18 is part of a motor. The slip ring 26 is in contact with a brush 10, also shown in FIG. 1 and FIG. 2. The brush 10 is a part of a motor. The brush 10 is connected to a HIGH input 20 of an AC amplifier 22. A LOW input 24 of the AC operational amplifier 22 is connected to the LOW output 14 of the AC signal source 6. The rotor 18 has a winding 28, shown in FIG. 2. The winding 28 electrically connects to the slip ring 26 and to a slip ring 16.

The AC signal source 6 generates an A.C. signal voltage, having an amplitude V1, on the slip ring 26. The frequency of the A.C. signal voltage can be selectively changed. An AC contact voltage is emitted from the brush 10, as a result of the AC signal voltage on the slip ring 26.

In FIG. 1, the HIGH output of the AC signal source 6 is connected to slip ring 26. The impedance between slip ring 26 and brush 10 of the motor is under test. Slip ring 26 and brush 10 are the contact elements involved in the impedance test.

The amplitude of the A.C. signal voltage, generated by the AC signal source 6, can be changed, Thus the amplitude of an A.C. current passing to slip ring 26 can be changed.

An AC signal voltage, designated V1, comes out of the signal source 6. This AC signal voltage V1 is applied to slip ring 26. The signal voltage V1 is also applied to the REF input 30, that is, the reference input 30 of a phase angle voltmeter 32. A LOW input 34 of phase angle voltmeter 32 is connected to LOW output 14 of the signal source 6.

An AC current I passes into slip ring 26. The contact elements 26 and 10 may have a capacitance C. An AC contact voltage V2 is emitted from the contact element 10. The AC contact voltage V2 is applied to the AC voltage amplifier 22. The AC contact voltage V2 is the AC voltage from brush 10. V2=V1-IC. The AC contact voltage V2 is applied to voltage amplifier 22 An amplified AC contact voltage AV2 is emitted by the AC voltage amplifier 22 on HIGH output 36 of amplifier 22. Amplification factor A is the amplification of amplifier 22. The amplified contact voltage AV2 is applied to the signal input 38 of a phase angle voltmeter 32 from HIGH output 36. The LOW input 24 of amplifier 22 is connected to the LOW input 40 of phase angle voltmeter 32

The amplified contact voltage AV2 comes out of HIGH output 36 of amplifier 22. The voltage level of signal voltage V1 is adjusted. The amplification factor A is also adjusted, in order to make amplified contact voltage AV2 approximately equal to V1.

The output of phase angle voltmeter 32 is connected to an analog output device 42. The analog output device 42 indicates any phase difference between AC signal voltage V1 and amplified AC contact voltage AV2.

If there is no contamination between the contact elements 26 and 10, the phase of amplified contact voltage AV2 is the same as the phase of signal voltage V1. The phase angle voltmeter 32 will indicate any difference in phase between amplified contact voltage AV2 and signal voltage V1. If there is a contamination between brush 10 and slip ring 26, the phase of amplified contact voltage AV2 will lag the phase of signal voltage V1. The amount of lag in phase is an indication of the amount of contamination slip ring 26 and brush 10.

If there is a voltage phase difference, as detected by the phase angle voltmeter 32, this phase difference, which is identified as PAV2, comes out of the phase angle voltmeter 32. This phase difference, PAV2, is then passed to the analog output device 42. The analog output device 42 displays the phase difference, PAV2. The contact impedance between contact element 26 and contact element 10 can vary over time. The analog output device 42 shows variations in phase difference, over time, due to variations in the contact impedance, over time, between the contact elements 26 and 10. The analog output device 42 can record, over time, the phase difference value or phase difference values coming from the phase angle voltmeter 32.

A low alternating voltage signal is emitted by the signal source 6. The AC current produced between contact elements, namely brush 10 and slip ring 26 of the motor, due to the low alternating voltage signal, can be as low as 0.75 milliamps. The frequency of the voltage emitted by the signal source 6 is user selected, but the frequency must be within the frequency capability of the phase angle voltmeter 32. A low alternating voltage is sent across two contact elements under test, and this voltage is also inputted into the reference input of the phase angle voltmeter 32. The voltage output, from a second of the two contact elements, is amplified in FIG. 1, and is placed on the signal input 38 of the phase angle voltmeter 32.

The phase angle voltmeter 32 measures the fundamental amplitude and phase variations representative of contact element resistance and capacitance changes over time. By using 'Transfer Calibration Metrology', recorded measurements of voltage and phase are easily converted to milliohm measurement units of contact resistance.

The low excitation current capability of the present contact test circuit, subjects contact elements under test to less damaging or stressful measurement conditions than methods currently in use. The contact test circuit can provide higher excitation currents if needed.

Incorporating the tuned filtering capabilities of the phase angle voltmeter 32 eliminates the adverse effects of fringe noise and reduces the effects of DC stewing inherent with Low Pass or Notch Filtering techniques in use today. Recording the variation in phase change for various frequencies, provides a broad analysis database for characterization of the contact resistance of contaminates, as compared to a database that is obtained by using a single excitation frequency.

While the present invention has been disclosed in connection with the preferred embodiment thereof, it should be understood that there may be other embodiments which fall within the spirit and scope of the invention defined by the following claims.

What is claimed is:

1. A contact impedance test circuit for testing contact impedance caused by contaminate between a first electrical contact element and a second electrical contact element, comprising:
   (a) an AC signal source for applying an A.C. signal voltage to the first electrical contact element, an AC contact voltage being emitted from the second electrical contact element, the first electrical contact element being in physical contact with the second electrical contact element;
   (b) an AC operational amplifier for amplifying the AC contact voltage from the second electrical contact element, an amplified AC contact voltage being produced by the AC operational amplifier, a LOW input of the AC operational amplifier connected to a LOW output of the AC signal source; and
   (c) a phase angle voltmeter for detecting phase difference between a phase of the amplified AC contact voltage and a phase of the AC signal voltage at an instance of time, the phase angle voltmeter for detecting an amount of phase lag of the phase of the amplified AC contact voltage with respect to the phase of the AC signal voltage, phase lag caused by a capacitance portion of contact impedance, the AC signal voltage being applied to a reference input of the phase angle voltmeter, the amplified AC contact voltage being applied to a signal input of the phase angle voltmeter.

2. The contact impedance test circuit of claim 1 and further comprising an analog output device for recording phase lag values sensed by the phase angle voltmeter.

3. A method of measuring contact impedance caused by contaminate between a first electrical contact element and a second electrical contact element, comprising:
   (a) applying an AC signal voltage to the first electrical contact elements, an AC contact voltage being emitted by the second electrical contact element, the first electrical contact element being in physical contact with the second electrical contact element;
   (b) amplifying the AC contact voltage by means of an AC operational amplifier to produce an amplified AC contact voltage, and
   (c) detecting any phase lag of a phase of the amplified AC contact voltage with respect to a phase of the AC signal voltage by means of a phase angle voltmeter, phase lag caused by a capacitance portion of contact impedance.

4. The method of claim 3 wherein the AC contact voltage from the second electrical contact element is amplified by the AC operational amplifier, the amplified AC contact voltage and the AC signal voltage being sent to the phase angle voltmeter, the phase angle voltmeter determining an amount of phase lag of the phase of the amplified AC contact voltage with respect to the phase of the AC signal voltage.

* * * * *